United States Patent [19]

Heiduk

[11] Patent Number: 5,214,424
[45] Date of Patent: May 25, 1993

[54] BROADBAND SIGNAL SWITCHING EQUIPMENT

[75] Inventor: Gerhard Heiduk, Munich, Fed. Rep. of Germany

[73] Assignee: Siemens Aktiengesellschaft, Munich, Fed. Rep. of Germany

[21] Appl. No.: 760,492

[22] Filed: Sep. 16, 1991

[30] Foreign Application Priority Data

Sep. 26, 1990 [EP] European Pat. Off. ............ 90118489

[51] Int. Cl.⁵ .............................................. H04Q 1/00
[52] U.S. Cl. .............................. 340/825.91; 340/825.9
[58] Field of Search ............ 340/825.91, 825.9, 825.89, 340/825.88; 379/292; 307/468

[56] References Cited

U.S. PATENT DOCUMENTS

| | | | |
|---|---|---|---|
| 4,577,190 | 3/1986 | Law | 340/825.91 |
| 4,801,936 | 1/1989 | Hofmann | 340/825.91 |
| 4,998,101 | 3/1991 | Trumpp et al. | 340/825.91 |
| 5,043,724 | 8/1991 | Trumpp et al. | 340/825.91 |
| 5,121,111 | 6/1992 | Trumpp et al. | 340/825.91 |

FOREIGN PATENT DOCUMENTS 0262479 4/1988 European Pat. Off. .
0354254 2/1990 European Pat. Off. .

OTHER PUBLICATIONS

"Cascode Voltage Switch Logic" by Erdelyi et al, IBM Technical Disclosure Bulletin, vol. 27, No. 7A, Dec. 1984, pp. 3791-3793.
"Custom & Semi-Custom Design Techniques", by Heller et al, IEEE International Solid State Circuits Conference, Feb. 22, 1984, pp. 16-17.
"Digital CMOS Circuit Design", Kluwer Academic Publishers, 1986, pp. 198-200.

Primary Examiner—Sandra L. O'Shea
Assistant Examiner—Edwin C. Holloway, III
Attorney, Agent, or Firm—Hill, Steadman & Simpson

[57] ABSTRACT

In broadband signal switching equipment having a cross point matrix in FET technology whose switch elements respectively controlled by a holding memory cell are respectively formed by a series circuit of a switching transistor and of an input transistor, an n-channel series pass transistor that has its control electrode connected to a reference potential source is respectively inserted between the matrix output line and the following output amplifier circuit. This n-channel series pass transistor, together with a matrix output line pre-charging transistor connected to the input of the output amplifier circuit, forms a charge transfer circuit that effects a voltage amplification. A pre-charging transistor that also has its control electrode connected to the pre-charging phase/evaluation phase clock signal line is also connected to the input of an input driver circuit that precedes a matrix input line, a transfer gate that precedes the input driver circuit also being simultaneously controlled proceeding from this pre-charging phase/evaluation phase clock signal line.

7 Claims, 2 Drawing Sheets

BROADBAND SIGNAL SWITCHING EQUIPMENT

BACKGROUND OF THE INVENTION

If ECL technology can be characterized by properties such as high operating speed, (medium) high degree of integration and (medium) high dissipated power, then FET technology, having only medium operating speeds in comparison thereto, can be characterized by extremely high degree of integration and extremely low dissipated powers. These latter properties have led to efforts to provide integrated circuits in FET technology that operate in speed ranges that were previously found only in bipolar technology.

Thus, (for example, disclosed in European reference EP-A-0 262 79 corresponding to U.S. Pat. No. 4,801,936) prior art broadband signal switching equipment has a cross point matrix in FET technology whose switch elements are each respectively formed with a switching transistor that has its control electrode charged with a through-connect, or, respectively, inhibit signal and has its main electrode connected to the appertaining matrix output line. The switch elements each respectively have an auxiliary transistor that forms a series circuit with the switching transistor, this auxiliary transistor having its control electrode connected to the appertaining matrix input line and having its main electrode facing away from the series circuit connected via a sampling transistor to one terminal of the operating voltage source to whose other terminal the respective matrix output line is connected via a pre-charging transistor. The pre-charging transistor and sampling transistor (oppositely relative to one another) respectively have their control electrode charged with a switching matrix network drive clock that subdivides a bit through-connection time span into a pre-charging phase and into the actual through-connection phase. As a result, given an inhibited sampling transistor, the matrix output line in every pre-phase is at least approximately charged via the pre-charging transistor to the potential prevailing at the other terminal of the operating voltage source. This known broadband signal switching equipment that can have sampling transistors individually associated to switch elements or sampling transistors individually associated to a matrix input line or a matrix output line requires its own clock lines for driving these sampling transistors, these clock lines passing through the cross point matrix. This requires a corresponding surface area and involves a corresponding, capacitive loading of the matrix output lines. In order to guarantee an adequate resistance to noise, clock distribution and couplings between matrix input lines and matrix output lines require adequately high signal amplitudes on the matrix output lines, resulting in a relatively high power consumption.

Another known (for example, European reference EP-A-0 354 252 corresponding to U.S. Pat. No. 4,998,404) broadband signal switching equipment has a cross point matrix in FET technology whose inputs can each be respectively provided with an input driver circuit, whose outputs are respectively provided with an output amplifier circuit and whose switch elements respectively controlled by a holding memory cell are each respectively formed with a series circuit of a switching transistor that has its control electrode charged with a through-connect, respectively, inhibit signal and of an input transistor that has its control electrode connected to the appertaining matrix input line. This series circuit has the main electrode of the one transistor that faces away from the series circuit connected to the appertaining matrix output line, whereby the matrix output line is connected via a transistor to the one terminal of the operating voltage source. The main electrode of the other transistor facing away from the series circuit is continuously connected to the other terminal of the operating voltage source and the transistor series circuit of every switch element forms the cross point - associated, one branch of a differential amplifier whose other branch respectively shared by the cross points leading to one and the same output line is formed by the output amplifier circuit individually associated to matrix output line. The output amplifier circuit comprises a series circuit of a first transistor that has its control electrode line at the other terminal of the operating source and of a second transistor that has its control electrode charged with a reference voltage. This series circuit has the main electrode of the one transistor facing away from the series circuit connected to the appertaining matrix output line and has the main electrode of the other transistor that faces away from the series circuit and leads to the amplifier output connected via a load transistor to the other terminal of the operating voltage source.

This concept of a "distributed" differential amplifier requires, first, a relatively high precision of the said reference voltage and, thus, a correspondingly involved reference voltage generator; second, what is referred to as the transistor matching is also problematical for the distributed differential amplifier, i.e., offering transistors whose characteristics correspond to one another.

SUMMARY OF THE INVENTION

It is an object of the present invention to provide a broadband signal switching matrix network that avoids the drawbacks of the prior art.

The present invention is directed to a broadband signal switching equipment having a cross point matrix in FET technology, whose inputs can be respectively connected to an input driver circuit, whose outputs are respectively connected to an output amplifier circuit, and whose switch elements respectively controlled by a holding memory cell are each respectively formed with a series circuit of a switching transistor that has its control electrode charged with a through-connect, or, respectively, inhibit signal and of an input transistor that has its control electrode connected to the appertaining matrix input line. The series circuit has the main electrode of the one transistor facing away from the series circuit connected to the appertaining matrix output line which is in turn connected to a pre-charging potential source via a pre-charging transistor that has its control input connected to the clock signal line of a switching matrix network drive clock that subdivides a bit through-connect time span into a pre-charging phase and into an evaluation phase, whereby the input transistor is inhibited and the matrix output line is pre-charged in every pre-charging phase. This broadband signal switching matrix network is inventively characterized in that an n-channel series pass transistor that has its control electrode connected to a reference potential source and that forms a charge transfer circuit together with the pre-charging transistor lying at the input of the output amplifier circuit is respectively inserted between the matrix output line and the output amplifier circuit.

Let it be noted here that a charge transfer circuit comprising an n-channel series pass transistor that lies between two capacitative loads and has its control electrode charged with a reference voltage and comprising a clock-control pre-charging transistor is inherently known (from AnnaRatone, "Digital CMOS Circuit Design", Kluwer Academic Publishers 1986, pages 198 ... 200). Greater relevancy with the problems underlying the present invention and their solution, however, is not established by this prior art reference.

In addition to having the advantage of a voltage amplification connected with a charge transfer circuit of the recited type, the present invention yields the further advantage that an exact setting of the reference voltage is not required and an exact and sensitive reference voltage source is therefore also not required. On the contrary, the reference voltage can be easily derived from the operating voltage by internal voltage division, whereby it is expedient that, in a further development of the present invention, the reference voltage line is well-blocked by a capacitor vis-a-vis the reference potential (ground). A transistor matching likewise plays no part; technology-caused fluctuations in characteristics merely vary the signal boost on the output line on which, however, a small boost of, for example, 0.5 V is already sufficient in order to guaranty a reliable recognition of the respectively through-connected bit at the output amplifier, whereby a correspondingly low dissipated power also results from a small signal boost. The broadband signal switching matrix network of the present invention can also be operated with reduced signal boost on the input line.

When a sampling transistor (known from European reference EP-A-0 262 479) is not provided in the operating voltage supply of the switch element, the inhibit of the input transistor in every pre-charging phase can be effected, for example, with the assistance of gate circuits inserted into the input lines that respectively have their control input connected to the clock signal line and are controlled opposite the pre-charging transistors, as is likewise fundamentally known (from European reference EP-90107016.9 corresponding to U.S. Ser. No. 678,034, now U.S. Pat. No. 5,073,775).

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
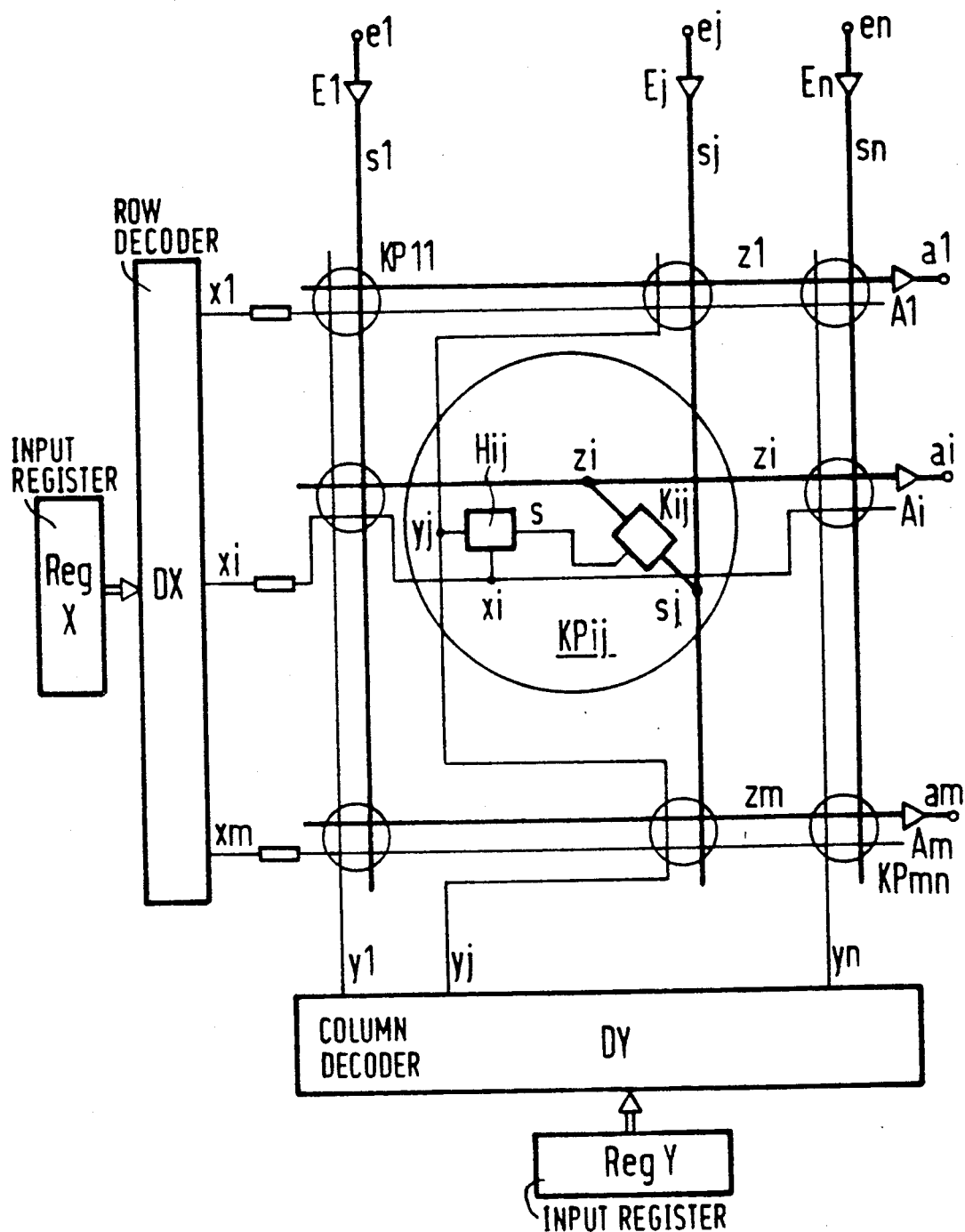
FIG. 1 is the schematic diagram of a broadband switching equipment.

In a scope necessary for an understanding of the present invention; FIG. 1 of the drawing schematically outlines a broadband signal switching equipment, input driver circuits $E1 \ldots Ej \ldots En$ being provided at the input $e1 \ldots ej \ldots en$ thereof and connected to column lines $s1 \ldots sj \ldots sn$ of a cross point matrix and the output $a1 \ldots ai \ldots am$ thereof connected to row lines $z1 \ldots zi \ldots zm$ of the cross point matrix and provided with output amplifier circuits $A1 \ldots Ai \ldots Am$.

The cross point matrix has cross points $KP11 \ldots KPij \ldots KPmn$ whose switch elements, as indicated in greater detail at the cross point $KPij$ for the switch element $Kij$ thereof, can be respectively controlled by a cross point - associated holding memory cell $Hij$ (at the cross point $KPij$) whose output s is connected to the control input of the respective switch element ($Kij$ at the cross point $KPij$).

According to FIG. 1, the holding memory cells ... $Hij$ ... are driven in two coordinates by two selection decoders, namely a row decoder DX and a column decoder DY, being driven via corresponding selection lines $x1 \ldots xi \ldots xm; y1 \ldots yj \ldots yn$.

As may be seen from FIG. 1, the two selection decoders DX, DY are respectively chargeable proceeding from input registers Reg X, Reg Y with a cross point row or, respectively, cross point column address shared by a matrix line (row or column) of cross points, in response whereto the selection decoders respectively output an "one" selection signal at the selection line respectively corresponding to the cross point line address. The coincidence of a row selection signal "1" and a column selection signal "1" at the intersection of the appertaining matrix row with the appertaining matrix column when setting up a corresponding connection then effects an activation of the holding memory cell situated there, for example the memory cell $Hij$. As a result the switch element, the switch element $Kij$ in the example, controlled by the appertaining holding memory cell ($Hij$) becomes transmissive.

So that the switch element $Kij$ under consideration in the example is in turn inhibited given a clear down of the appertaining connection, the selection decoder DX is again charged with the appertaining row address proceeding from the input register Reg X, so that the row decoder DX again outputs a row selection signal "1" at its output line $Xi$. Simultaneously, the column decoder DY, proceeding from its input register Reg Y, is charged, for example, with a dummy address or with the address of a column of unwired cross points, so that it outputs a column selection signal "0" at its output line $yj$. The coincidence of the line selection signal "1" and column selection signal "0" then effects the resetting of the holding memory cell $Hij$, resulting in the switch element $Kij$ controlled by it being inhibited.

The holding memory cells ... $Hij$ ... can be fashioned in an inherently known manner, for example as disclosed by European reference EP-A-0238 834 (corresponding to U.S. Pat. No. 4,785,299 hereby incorporated by reference). They therefore need not be set forth in greater detail here.

Figure 2:
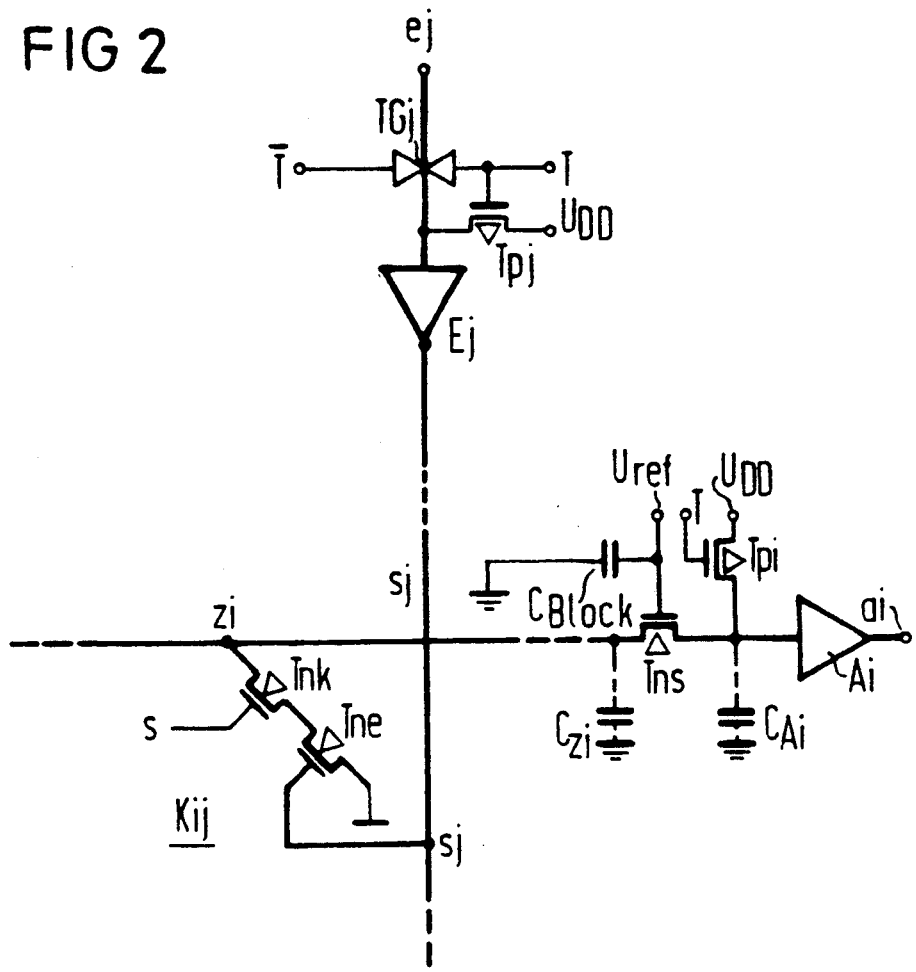
FIG. 2 is a circuit-oriented realization in conformity with the present invention.
Figure 3:
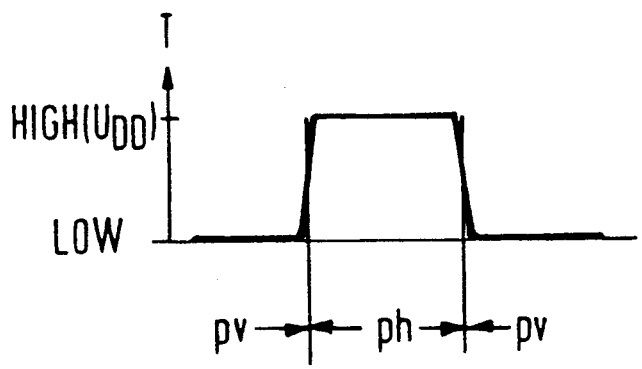
FIG. 3 is a graph showing the switching matrix network through-connect clock therein.

A circuit embodiment of the switch elements ... $Kij$ ... is depicted in FIG. 2. The switch elements ... $Kij$ ... are each respectively formed with a series circuit of a switching transistor $Tnk$ that has its control electrode charged from the holding memory cell with a through-connect or, respectively, inhibit signal and of an input transistor $Tne$ that has its control electrode connected to the appertaining matrix input line $sj$, this series circuit having the main electrode facing away from the series circuit in the one transistor $Tnk$ connected to the appertaining matrix output line $zi$. The matrix output line $zi$ is in turn connected via an n-channel series pass transistor $Tns$ to the input of the output amplifier circuit $Ai$, whereby a pre-charging transistor $Tpi$ also is connected to the input of the output amplifier circuit Ai, the appertaining matrix output line zi being connected to a pre-charging potential source $U_{DD}$ via this pre-charging transistor Tpi (in series with the series pass transistor Tns) in every pre-charging phase pv (see FIG. 3) of a bit through-connect time span that is divided by a switching matrix network drive clock T (FIG. 3) into such a pre-charging phase pv (FIG. 3) and into an evaluation phase ph (FIG. 3). To that end, the pre-charging transistor Tpi has its control input connected to the clock signal line T (FIG. 2) of the switching matrix network drive clock.

The n-channel series pass transistor Tns inserted between the matrix output line zi and the output amplifier circuit Ai has its control electrode connected to a reference potential source $U_{ref}$, whereby the relationship $U_{ref} < U_{dd}$ is valid for the reference potential $U_{ref}$ and the pre-charging potential $U_{DD}$. The reference potential source $U_{ref}$ is well-blocked vis-a-vis ground by a capacitor $C_{block}$.

Together with the pre-charging transistor Tpi connected to the input of the output amplifier circuit Ai, the n-channel series pass transistor Tns connected between the matrix output line zi and the output amplifier circuit Ai forms a charge transfer circuit which shall be discussed later in the following, more detailed explanation of the functioning of the circuit arrangement depicted in FIG. 2. First, however, let the circuit-oriented fashioning at the input ej of the broadband signal switching equipment that leads to the column line sj of the cross point matrix be considered. According to FIG. 2, the matrix input line (column line) sj is preceded by an input driver circuit Ej that is in turn preceded by a transfer gate TGj that has its two control inputs connected to the clock signal line T that carries the switching matrix network drive clock or, respectively, to a clock signal line T that carries the inverted switching matrix network drive clock. A further pre-charging transistor Tpj that likewise has its control electrode connected to the pre-charging phase/evaluation phase clock signal line T is connected to the input of the input driver circuit Ej.

The circuit arrangement depicted in FIG. 2 functions as follows. During the pre-charging phase (pv in FIG. 3), the pre-charging transistor Tpj of the input side is transmissive, so that the input of the input driver circuit Ej proceeds to a control potential due to which the output of the input driver circuit Ej and, thus, the column line sj proceeds to reference potential OV, ground), with the result that the input transistor Tne and, thus, the series circuit of input transistor Tne and switching transistor Tnk as well proceeds into the inhibited condition. In a pre-charging phase (pv in FIG. 3), the input of the output amplifier Al is drawn via the pre-charging transistor Tpi to the $U_{dd}$ potential, resulting in the matrix output line (row line) zi proceeding to a potential $U_{ref} - U_{th}$ via the n-channel series pass transistor Tns, $U_{th}$ being the threshold voltage of the series pass transistor Tns.

The pre-charging phase (pv in FIG. 3) ends with the change of the switching matrix network drive clock signal T from LOW to HIGH ($U_{dd}$), after which begins the following evaluation phase (ph in FIG. 3). The pre-charging transistor Tpj at the input of the input driver circuit Ej is inhibited and the transmission gate TGj becomes transmissive, with the result that the matrix input line (column line) sj remains at its previous potential (OV, ground) or is charged dependent on the bit to be through-connected that is just pending at the input Ej.

In the former instance, the potential of the matrix output line (row line) zi remains unmodified, whereas, in the second instance, the matrix output line zi is discharged via the series circuit of input transistor Tne and switching transistor Tnk of the switching element Kij situated in the through-connect condition that is just under consideration. Due to this change in potential on the matrix output line zi, the n channel series pass transistor Tns that had previously proceeded into the inhibited condition during the pre-charging phase given downward transgression of its threshold voltage becomes transmissive due to what is now an upward transgression of its threshold voltage and the electrical charge proceeds from the input of the output amplifier circuit Ai charged to the $U_{dd}$ potential to the matrix output line zi via the series pass transistor Tns. The relationship $$\frac{U_{Ai}}{U_{zi}} = \frac{C_{zi}}{C_{Ai}},$$

is thereby valid for the relationship of the voltage boost $U_{Ai}$ at the input of the output amplifier circuit Ai to the voltage boost $U_{zi}$ on the matrix output line zi, whereby $C_{zi}$ denotes the capacitance of the matrix output line zi and $C_{Ai}$ denotes the circuit capacitance effective at the input of the output amplifier circuit Ai. Since the capacitance $C_{zi}$ of the long matrix output line (row line) zi is far greater than the capacitance $C_{Ai}$ at the input of the output amplifier circuit Ai, this leads to a corresponding voltage amplification at the input of the output amplifier Ai, so that a small signal boost on the matrix output line zi is sufficient to guarantee a reliable recognition of the respectively through-connected bit at the output amplifier Ai. This bit can then be clocked off by the output amplifier circuit Ai at the end of the evaluation phase (ph in FIG. 3).

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A broadband signal switching equipment having a cross point matrix in FET technology, the cross point matrix having a plurality of matrix input lines and matrix output lines, having outputs each respectively provided with an output amplifier circuit, and having switch elements controlled by a respective holding memory cell, each switch element being a series circuit of a switching transistor that has its control electrode charged with a through-connect or, respectively, inhibit signal and of an input transistor that has its control electrode connected to an associated matrix input line, the series circuit having a main electrode of one of the transistors in the series circuit connected to an associated matrix output line, which is in turn connected to a pre-charging potential source via a pre-charging transistor that has its control input connected to a clock signal line of a switching matrix network drive clock that subdivides a bit through-connect time span into a pre-charging phase and into an evaluation phase, whereby, in every pre-charging phase, the input transistor is inhibited and the matrix output line is pre-charged, comprising: an n-channel series pass transistor that has its control electrode connected to a reference potential source and that forms a charge transfer circuit together with the pre-charging transistor that is connected to an input of the respective output amplifier circuit, the n-channel series pass transistor being connected between the respective matrix output line and the input of the respective output amplifier circuit.

2. The broadband signal switching equipment according to claim 1, wherein the reference potential source is blocked relative to ground by a capacitor.

3. The broadband signal switching equipment according to claim 1, wherein a further pre-charging transistor is provided at an input of a respective input driver circuit that precedes its respective matrix input line and has its control electrode connected to the clock signal line, and wherein a transfer gate is connected between the respective input of the cross point matrix and the input of the respective input driver circuit, the transfer gate being also connected to the clock signal line for control thereof.

4. A broadband signal switching equipment having a cross point matrix in FET technology, the cross point matrix having a plurality of matrix input lines and matrix output lines, having a plurality of inputs connected respectively to the matrix input lines having a plurality of outputs connected respectively to the matrix output lines via output amplifier circuits, having a plurality of respective switch elements each controlled by a respective holding memory cell and formed by a series circuit of a switching transistor that has its control electrode charged with a through-connect or, respectively, inhibit signal and of an input transistor that has its control electrode connected to a respective matrix input line, said series circuit having a main electrode connected to a respective matrix output line, comprising:

a plurality of n-channel series pass transistors each having a control electrode connected to a reference potential source, a first electrode connected to a respective matrix output line and
a second electrode connected to an input of a respective output amplifier circuit; and
a plurality of pre-charging transistors each having a first electrode connected to a pre-charging potential source, a second electrode connected to an input of a respective output amplifier circuit and a control electrode connected to the clock signal line;
wherein, in the plurality of n-channel series pass transistors and the plurality of pre-charging transistors, a respective n-channel series pass transistor and a respective pre-charging transistor form a respective charge transfer circuit, and wherein the clock signal line carries a switching matrix network drive clock that subdivides a bit through-connect time span into a pre-charging phase and into an evaluation phase, whereby, in every pre-charging phase, the respective input transistor is inhibited and the respective matrix output line is pre-charged.

5. The broadband signal switching equipment according to claim 4, wherein a blocking capacitor is connected between the reference potential source and ground.

6. The broadband signal switching equipment according to claim 4, wherein the broadband signal switching equipment further comprises a plurality of further pre-charging transistors and a plurality of transfer gates, and wherein for each of a plurality of input driver circuits a respective pre-charging transistor is connected to the input of the input driver circuit and has its control electrode connected to the clock signal line and a transfer gate is connected between the input driver circuit and the respective input of the cross point matrix and is connected to the clock signal line and controlled by the drive clock.

7. A broadband signal switching equipment having a cross point matrix in FET technology, the cross point matrix having a plurality of matrix input lines and matrix output lines, having a plurality of inputs connected respectively to the matrix input lines via input driver circuits, having a plurality of outputs connected respectively to the matrix lines via output amplifier circuits, having a plurality of respective switch elements each controlled by a respective holding memory cell and formed by a series circuit of a switching transistor that has its control electrode charged with a through-connect or, respectively, inhibit signal and of an input transistor that has its control electrode connected to a respective matrix input line, said series circuit having a main electrode connected to a respective matrix output line, comprising:

a plurality of n-channel series pass transistors each having a control electrode connected to a reference potential source, a first electrode connected to a respective matrix output line and a second electrode connected to an input of a respective output amplifier circuit; and
a plurality of pre-charging transistors each having a first electrode connected to a pre-charging potential source, a second electrode connected to an input of a respective output amplifier circuit and a control electrode connected to the clock signal line;
in the plurality of n-channel series pass transistors and the plurality of pre-charging transistors, a respective n-channel series pass transistor and a respective pre-charging transistor forming a respective charge transfer circuit, and the clock signal line carrying a switching matrix network drive clock that subdivides a bit through-connect time span into a pre-charging phase and into an evaluation phase, whereby, in every pre-charging phase, the respective input transistor is inhibited and the respective matrix output line is pre-charged;
a blocking capacitor is connected between the reference potential source and ground;
a plurality of further pre-charging transistors and a plurality of transfer gates, for each of the input driver circuits a respective pre-charging transistor connected to the input of the input driver circuit and having its control electrode connected to the clock signal line and a transfer gate connected between the input driver circuit and the respective input of the cross point matrix and connected to the clock signal line and controlled by the drive clock.

* * * * *